Nov. 5, 1968 W. T. MATZEN, JR 3,409,810

GATED SYMMETRICAL FIVE LAYER SWITCH WITH SHORTED EMITTERS

Filed March 31, 1964

INVENTOR.
WALTER T. MATZEN JR.
BY
E. Mickey Hubbard
ATTORNEY

United States Patent Office 3,409,810
Patented Nov. 5, 1968

3,409,810
GATED SYMMETRICAL FIVE LAYER SWITCH WITH SHORTED EMITTERS

Walter T. Matzen, Jr., Richardson, Tex., assignor to Texas Instruments Incorporated, Dallas, Tex., a corporation of Delaware Filed Mar. 31, 1964, Ser. No. 356,195
5 Claims. (Cl. 317—235)

ABSTRACT OF THE DISCLOSURE

The present invention relates to semiconductor switching devices, and more particularly, but not by way of limitation, to a symmetrical controlled rectifier switch.

Symmetrical n-p-n-p-n type switches having two terminals are presently used for various control functions. This type of switch is term symmetrical because the switch has a voltage-current curve that is symmetrical about the origin and because the device usually has a symmetrical physical geometry. The symmetrical voltage-current curves are characterized by relatively high voltage steps at low current values and subsequent low voltage and high current regions at current values greater than a minimum holding current. These switches are usually turned "on" or "triggered" by superimposing a control voltage on the operating voltage across the device so as to exceed the break-over voltage and switch the device into the low voltage, high current region of the curve. When using this switching technique, it is essential for proper control that the break-over voltage of the device be established and held within close tolerances.

The present invention contemplates a gated n-p-n-p-n switch which can be selectively triggered "on" to conduct large currents in either or both directions. The gated switch may be turned on in either direction by a gate current without changing the voltage across the device, so long as the applied voltage exceeds a minimum switching voltage. In operation, the device of the present invention is equivalent to two similar silicon controlled rectifiers connected in parallel but having opposite polarities, yet is an integrated device having a novel construction hereafter described in greater detail.

The switching device constructed in accordance with the present invention comprises a first n-type semiconductor region having p-type semiconductor base regions disposed on opposite sides thereof to form collector-base junction areas which are substantially equal and coextensive in area, but have opposite bias directions. Second n-type semiconductor regions extend over only portions of the opposite sides of the p-type semiconductor regions to form emitter-base junction areas which are substantially equal in area and have opposite bias directions, but which are not coextensive. Electrodes are disposed over the face of the second n-type region and the exposed portion of the p-type regions and are in ohmic contact with each to short out one edge of each of the emitter-base junction areas and also provide the necessary electrodes for the p-type emitter regions and the n-type emitter regions. A suitable gate electrode is connected to each of the p-type semiconductor regions so that a gate current can be injected into each of the p-type base regions at a point transversely spaced from the shorted side of the respective emitter-base junction area.

The device is normally "off" in both directions. As a gate current is passed transversely across the respective base region to the shorted edge of the emitter-base junction, the resistance drop across the respective p-type base region is sufficient to forward bias the emitter-base junction, causing the emitter-base junction to conduct and trigger the device "on" in that particular direction. The device can be triggered "on" in either or both directions by applying a trigger current to the appropriate gate electrode. The invention also contemplates a novel planar construction for the integrated switching device which will hereafter be described in detail.

Therefore, an important object of the present invention is to provide an integrated switching device which can be triggered "on" in either or both directions.

Another object of this invention is to provide a switching device of the type described in which precise control of the break-over voltages for switching the device is not required.

Another object of the invention is to provide a switching device of the type described which can be controlled by a feedback signal to permit various control functions.

Still another object of the invention is to provide a switching device of the type described wherein the required holding current can be determined primarily by the design and geometry of the device.

Still another object of the invention is to provide a switching device of the type described having a planar construction and the associated desirable characteristics of low leakage, D.C. blocking stability, and high reliability.

Many additional objects and advantages will be evident to those skilled in the art from the following detailed description and drawing wherein.

Figure 1:
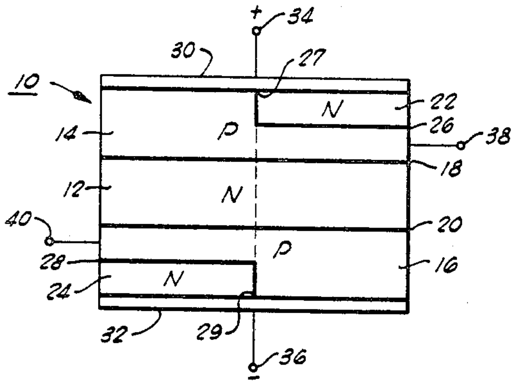
FIGURE 1 is a schematic sectional view of a switching device constructed in accordance with the present invention.

Referring now to the drawing, and in particular to FIGURE 1, a switching device constructed in accordance with the present invention is indicated generally by the reference numeral 10. The switching device 10 comprises a central n-type semiconductor region 12 which is sandwiched between p-type semiconductor regions 14 and 16 to form p-n junction areas 18 and 20, respectively. The junction areas 18 and 20 are geometrically coextensive and have opposite bias directions in the conventional sense. Second n-type semiconductor regions 22 and 24 form junction areas 26 and 28, respectively. It will be noted that the junction areas 26 and 28 extend over different halves of the p-type regions 14 and 16, respectively, and may be considered as having substantially no coextensive areas. The junction areas 26 and 28 are substantially equal and have opposite conventional bias directions. Electrodes 30 and 32 are disposed over and are in ohmic contact with the faces of the regions 14 and 22, and 16 and 24, respectively, and short out the edges 27 and 29 of the junction areas 26 and 28, respectively. Suitable terminals 34 and 36 are connected to the electrodes 30 and 32. Gate terminals 38 and 40 are connected to the p-type regions 14 and 16, respectively, for injecting current into the respective regions to trigger the device "on" as will presently be described. It will be noted that the gate terminals 38 and 40 are connected to the p-type regions 14 and 16 on the side in which the n-type regions 24 and 22 are inset opposite the shorted junction edges 27 and 29 so that trigger current injected through the gates must either pass through the adjacent emitter-base junction or flow transversely across the emitter-base junction areas to the electrodes. The resistance drop from that portion of the gate current flowing across the base region to the shorted edge can be made sufficiently great to forward bias the emitter-base junction and cause conduction to a sufficient degree to trigger the device "on."

It will be noted that the construction illustrated in FIGURE 1 forms a pair of gated p-n-p-n type switches facing in the opposite directions, i.e., having opposite bias directions. For example, the regions 14, 12, 16 and 24 form a gated p-n-p-n type switch having a forward biased direction from terminal 34 to terminal 36. On the other hand, the semiconductor regions 16, 12, 14 and 22 form a gated p-n-p-n type switch having a positive biased direction from terminal 36 to terminal 34.

In the p-n-p-n type switch including the n-type region 24, the p-type region 14 acts as an emitter, the n-type region 12 acts as a base, junction 18 acts as an emitter-base junction, the junction 20 acts as a collector junction, the p-type region 16 acts as a base, and the n-type region 24 acts as an emitter to form an emitter-base junction 28 in the conventional manner. However, as previously mentioned, the edge 29 of the emitter-base junction is shorted by the electrode 32 which is in ohmic contact with both the n-type region 24 and the p-type region 16.

Similarly, in the p-n-p-n type switch formed by the n-type region 22, the p-type region 16 acts as an emitter, the n-type region 12 acts as a base, junction 20 acts as an emitter-base junction, the junction 18 acts as a collector junction, the p-type region 14 acts as a base, and the n-type region 22 acts as an emitter to form an emitter-base junction 26 in the conventional manner. However, as in the case described above, the edge 27 of the emitter-base junction is shorted by the electrode 30 which is in ohmic contact with both the n-type region 22 and the p-type region 14.

Figure 2:
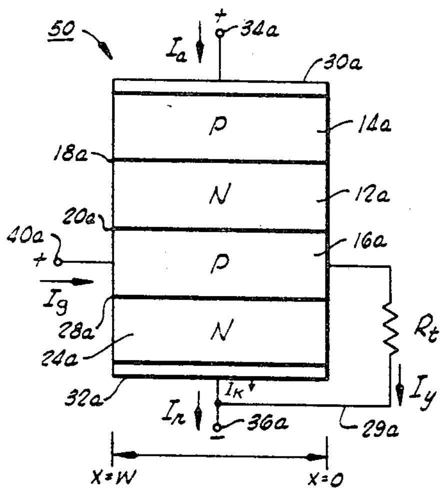
FIGURE 2 is a schematic circuit model of one-half of the switching device of FIGURE 1 and serves to illustrate the mode of operation of the device of FIGURE 1.

Assume now that a positive voltage is impressed across the terminal 34 with respect to that of terminal 36. The p-n-p-n type switch formed by the right-hand side of the device, when referring to FIGURE 1, is reverse biased such that it is essentially non-conductive. The left-hand half of the device 10 can then be represented by the electrical model illustrated in FIGURE 2 and designated generally by the reference numeral 50. The component parts in the model 50 are designated by the reference numerals of the corresponding parts of the device 10 followed by the subscript "*a*." The junction **18*a* is forward biased and is conductive. As mentioned, the junction 20*a* now acts as a collector junction, the junctions 28*a* and 18*a* act as emitter-base junctions, and the p-type region 16*a* and the n-type region 12*a* act as bases. The transverse resistance of the p-type region 16 under the junction 20 is represented by the resistance $R_t$ and the transverse short across the emitter-base junction is represented by the conductor 29*a***.

Assume now that a current $I_a$ is introduced through the terminal **34*a*. For small values of $I_a$, a major portion of the current passes transversely across the base region 16*a* as a result of the shorting conductor 29*a* and finally arrives at the cathode terminal 36*a*. This transverse base current through the conductor 29*a* is represented by $I_y$. As a result of the short caused by the conductor 29*a*, the voltage across the emitter-base junction 28*a* is zero at the edge $x=0$ adjacent the conductor 29*a* and the emitter-base junction 28*a* is therefore non-conductive at that point. However, at the opposite edge of the emitter-base junction 28*a*, represented at point $x=w$, a voltage is applied across the emitter-base junction as a result of the IR drop across the transverse width of the base region 16*a* which is approximately equal to $I_yR_t$. If the current $I_a$ and the transverse base resistance $R_t$ are sufficiently high, portions of the current $I_a$ will pass through the emitter-base junction 28*a***.

Due to the location of the gate terminal **40*a*, a gate current $I_g$ injected through the gate will add to the transverse current $I_y$ and similarly produce a voltage across the left-hand edge of the emitter-base junction 28*a*. As the potential across the emitter-base junction 28*a* increases, either as a result of an increase in $I_a$ or $I_g$, the emitter-base junction becomes progressively more conductive until the collector junction 20*a* is finally switched on and assumes a forward bias. At this point it should be pointed out that the gate current $I_g$ must be introduced in such a manner that the current must pass along through the base region 16*a* and transversely of the emitter-base junction 28*a* before reaching the shorted edge 29*a* of the emitter-base junction so as to establish the necessary potential across the emitter-base junction 28*a*** in the forward direction required to trigger the device "on."

Figure 3:
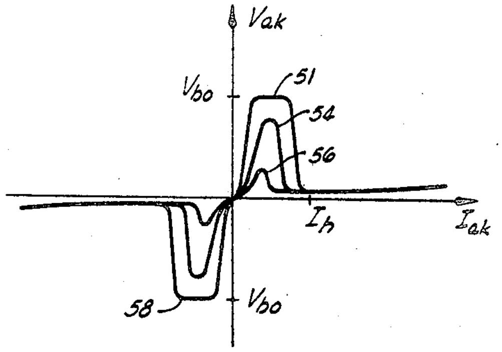
FIGURE 3 shows a family of current-voltage curves illustrating the operation of the device of FIGURE 1.

The device will continue to conduct so long as a minimum holding current is maintained. When the voltage across the terminals 34 and 36 of the device 10 is reversed, the p-n-p-n type switch formed by the left-hand side of the device is reverse biased such that it is essentially non-conductive and the right-hand half of the device then functions in the same manner as the model 50. The voltage-current characteristics of the device 10 with no gate current $I_g$ injected by either gate is illustrated by the curves 51 and 58 in FIGURE 3. It will be noted that the device has relatively high break-over voltages $V_{bo}$ and $-V_{bo}$ with gate current to either gate. However, as the gate current $I_g$ injected into the base region 16 by the gate 40, for example, becomes progressively greater, the break-over voltage required to trigger the device in the forward direction is progressively reduced as represented by the curves 54 and 56. Similarly, as the gate current introduced through gate terminal 38 is increased, the negative break-over voltage $-V_{bo}$ is progressively reduced as illustrated by the curves of FIGURE 3. Thus it will be evident that the device may be selectively triggered "on" in either or both directions at substantially any break-over voltage by gate currents injected through the respective gate terminals.

After the device is triggered "on" in either direction, a minimum holding current $I_h$ (see FIGURE 3) through the device must be maintained in order for the device to continue in the high conductance, low voltage state. The current equation for the model 50 is $$I_a+I_g=I_y+I_k \quad (1)$$

where $I_a$ is the current introduced through electrode **30*a*, $I_g$ is the current through the gate 40*a*, $I_y$ is the current through the transverse base resistance $R_t$, and $I_k$ is the current from that portion of the electrode 32*a* over the n-type emitter region 24*a*. As $I_a$ approaches the holding current $I_h$, the current $I_k$ approaches zero. Then assuming that the gate current $I_g$ is zero, $I_h$ is approximately equal to $I_y$. The value of $I_h$ may be calculated by considering that as $I_a$ is decreased and approaches the holding current $I_h$, the current $I_k$ is concentrated at $x=w$ which is the point remote from the shorted edge 29*a* so that the base current $I_y$ must flow transversely across essentially the entire p-type base region 16*a*** having the resistance $R_t$. For a linear structure, $$R_t=\frac{w}{\sigma tL} \quad (2)$$

where $\sigma$ is the average conductivity of the sheet of p-type material forming the base region **16*a*, $t$ is the thickness of the base region 16*a***, w is the width of the emitter-base junction, and L is the length of the emitter-base junction. Therefore, the transverse base current $I_y$ may be expressed as $$I_y=\frac{V_{be|x=w}}{R_t} \quad (3)$$

wherein $V_{be}|_{x=w}$ is the voltage across the emitter-base junciton **28*a*** at $x=w$. Therefore, as $I_a$ approaches the holding current $I_h$, the cathode current $I_k$ approaches zero and, assuming the gate current $I_g$ is still zero, $$I_h=\frac{V_{be|x=w}}{R_t} \quad (4)$$

Since $V_{be}$ does not vary greatly with current density or impurity concentrations, the holding current $I_h$ is determined primarily by the geometry of the emitter and the sheet resistance of the base region adjacent to the emitter so that the holding current values can be designed into the device.

Figure 4:
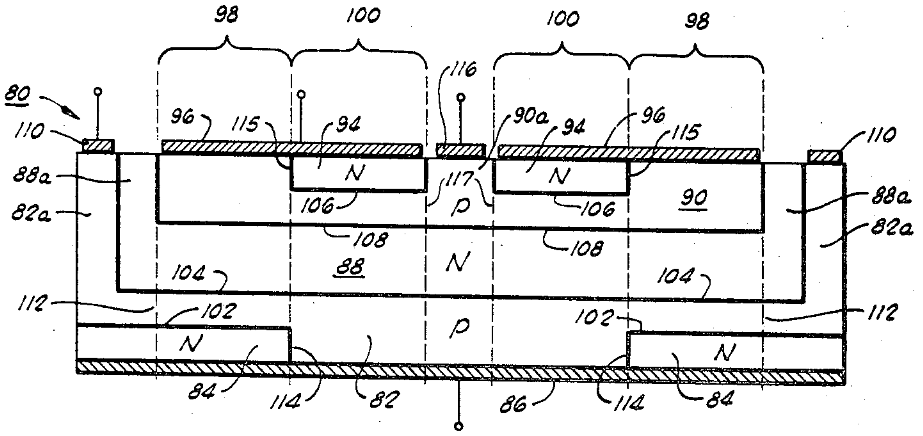
FIGURE 4 is a somewhat schematic sectional view of a switching device constructed in accordance with the present invention.

Referring now to FIGURE 4, a planar switching device constructed in accordance with the present invention by diffusion techniques is indicated generally by the reference numeral 80. FIGURE 4 is a sectional view taken generally along the axis of a circular device with the axial dimension exaggerated. The device has an n-type region 88. An annular p-type region 82 is disposed in the n-type region 88 and an annular n-type region 84 is disposed in the lower face of the p-type region 82. A conductive cathode film 86 is in ohmic contact with the exposed surfaces of both regions 82 and 84. An annular p-type region 82*a* extends from the p-type region 82 to the surface of the device to form a gate contact for the p-type base region as will presently be described. A second circular p-type region 90 is disposed in the center of the n-type region 88. An annular n-type region 88*a* extends from the region 88 to the surface of the device to separate the two p-type regions 82 and 90. An annular n-type region 94 is disposed in the p-type region 90. A central portion 90*a* of the p-type region 90 extends to the surface of the device to form a gate contact, as will presently be described. A conductive electrode 96 is disposed over both the p-type region 90 and the n-type region 94 and is in ohmic contact with both regions.

It will be noted that the outer diameter of the annular n-type region 94 is approximately equal to the inner diameter of the annular n-type region 84 and that a radial cross section taken from the center of the circular device corresponds closely to the cross section illustrated in FIGURE 1. Therefore, concentric p-n-p-n switches are formed in the annular areas 98 and 100 indicated by the brackets which have opposite forward bias directions. The p-n-p-n switch in the area 98 has an emitter-base junction 102 formed between the p-type base region 82 and the n-type emitter region 84, a collector junction 104 formed between the p-type base region 82 and the n-type base region 88, and the p-type region 90 forms the other emitter-base junction 108 with n-type region 88 as in the conventional p-n-p-n device. However, the inner edge 114 of the annular emitter junction 102 is shorted by the electrode 86. The p-n-p-n type switch formed in the annular area 100 has an emitter-base junction 106 formed between the p-type base region 90 and the n-type emitter region 94, a collector junction 108, an emitter-base junction 104 between a p-type emitter region 82 and an n-type base region 88. The outer edge 115 of the emitter-base junction 106 is shorted by the electrode 96 as previously described.

As previously mentioned, FIGURE 4 is somewhat schematic and the thickness dimension is greatly exaggerated. In practice, the device is quite thin such that making the gate connections to the p-type base regions presents a considerable problem. However, electrical contact is made with the p-type base region 82 by means of the cylindrical portions 82*a* and an annular gate electrode 110. It will be noted that current from the gate electrode 110 is introduced to the p-type base region of the p-n-p-n type switch represented by the area 98 at the outer edge 112 of the emitter-base junction 102 opposite the inner shorted edge 114 of the emitter-base junction that is shorted by the electrode 86. Thus the current introduced through the gate electrode 110 must either pass directly across the emitter-base junction or flow from the outer edge 112 transversely through the base region before it reaches the shorted inner edge 114 of the emitter-base junction 102 and therefore provides the transverse voltage drop necessary to forward bias the emitter-base junction and trigger the device "on."

Similarly, gate current is injected into the p-type base region of the p-n-p-n type switch represented by the area 100 between the emitter-base junction 106 and the collector junction 108 through the center portion 90*a* and a gate electrode 116. Again it will be noted that the gate current enters the area 100 of the base region at the inner edge 117 of the emitter-base junction which is opposite from the outer edge 115 which is shorted by the electrode 96 so that the gate current must either pass across the emitter-base junction or pass transversely across the base region 90 to the electrode 96 to provide the resistance drop and forward bias necessary to trigger the device "on."

It will be evident that the operation of the device 80 is identical to the operation of the device 10 as previously described and can be selectively triggered "on" in either or both directions at various applied voltages by varying the respective gate currents. However, in order for the device to have a symmetrical voltage-current curve, the concentric areas 98 and 100 should be equal, the n-type emitter regions 84 and 94 should have equal penetrations and surface concentrations, the p-type base regions 82 and 90 should have equal penetrations and surface concentrations, and the transverse resistance of the p-type base region 82 in the area 98 should be equal to the transverse resistance of the p-type base region 90 in the area 100. Since the p-type regions form emitters as well as bases, the p-type regions should have fairly high surface concentrations so as to provide a low "on" voltage and good sensitivity. Yet the transverse resistances of the base regions 82 and 90 in the areas 98 and 100, respectively, should be high to maintain reasonably low holding and trigger currents. These objectives may be achieved simultaneously if the p-type region 82 in the area 98 and the p-type region 90 in the area 100 forming the base regions are thin. Other design considerations in constructing the switching device of the present invention correspond to design considerations for conventional p-n-p-n devices.

It will be appreciated that if the areas 98 and 100 are equal, then the transverse base resistance of the p-type zone 90 in the area 100 cannot be precisely equal to the transverse base resistance of the p-type zone 82 in the area 98 if the circular configuration of FIGURE 4 is used. Therefore, even though the circular configuration is desirable from a fabrication standpoint, the device 80 can be made to have some other geometrical configuration, such as rectangular, so that the transverse base resistances can be made substantially equal. Then the holding currents and trigger currents for the two oppositely oriented p-n-p-n sections can be made substantially equal. In such a case, the total diametric cross-sectional geometry illustrated in FIGURE 4 may be used, or if desired, only the radial cross section may be used.

The switching devices 10 and 80 have been described as n-p-n-p-n type structures because the diffusion technology relating to this general type of construction is more developed at the present time. However, it will be appreciated by those skilled in the art that each of the five zones may be reversed so as to produce a p-n-p-n-p structure, in which case the currents involved would also be reversed in the conventional manner. Accordingly, it is to be understood that although particular types of semiconductor regions have been described and are recited in the appended claims for purposes of simplicity, the various regions may be reversed without departing from the scope of the invention.

From the above detailed description of preferred embodiments of the present invention, it will be evident to those skilled in the art that a novel and highly useful switching device has been described. The device is symmetrical and can be selectively triggered "on" in either or both directions by applying gate current such as to reduce break-over voltages to relatively low values. The device will find many useful applications, particularly in the control of alternating current power. Due to the novel construction, the minimum holding current can be established primarily by the geometric design and material resistances of the device. Further, only the minimum break-over voltage need be specified because of the wide range of maximum break-over voltages obtainable by variations in the magnitudes of the gate currents. As compared to the two-terminal p-n-p-n type switches, the external gate contact facilitates the use of feedback, which is very useful in motor control circuits for providing a relatively constant torque over a wide range of speeds.

Having thus described several preferred embodiments of the invention, it is to be understood that various changes, substitutions and alterations can be made therein without departing from the spirit and scope of the invention as defined by the appended claims.

What is claimed is:

1. A gated semiconductor switching device comprising a semiconductor body having:

a first n-type semiconductor region;

substantially coextensive first and second p-type semiconductor regions on each side of the first n-type semiconductor region forming junctions therewith;

second and third n-type semiconductor regions adjacent the first and second p-type semiconductor regions, respectively, forming first and second emitter-base junction areas over portions of the respective first and second p-type semiconductor regions which are not coextensive leaving exposed portions of the respective p-type semiconductor regions;

two n-region terminal means, one connected to the second and one connected to the third n-type semiconductor regions;

two p-region terminal means, one connected to the first and one connected to the second p-type semiconductor regions;

two conductor means each connecting an n-region terminal to its adjacent p-region terminal, and gate terminal means connected to the respective p-type semiconductor regions for introducing a gate current in each of the p-type semiconductor regions at an edge of the emitter-base junction opposite from the shorted edge of the respective emitter-base junction such that the gate current will flow either through the respective emitter-base junction or flow transversely through the respective p-type semiconductor region before it reaches the shorted junction and forward bias the emitter-base junction causing it to conduct and trigger the device "on."

2. A gated semiconductor switching device comprising:

a semiconductor body having opposite first and second faces;

a first annular n-type region disposed adjacent the first face;

a first p-type region disposed adjacent the first n-type region and forming an annular emitter-base junction therewith, the p-type region having a central portion adjacent the first face and an annular portion extending to the second face;

a circular second n-type region disposed adjacent the first p-type region and forming an active junction therewith, the second n-type region having an annular portion extending to the second surface, said second n-type region not being coextensive with said first n-type region;

a second p-type region disposed adjacent the second n-type region and forming an active junction therewith, the second p-type region having a central portion extending to the second surface and an annular portion extending to the second surface;

an annular third n-type region disposed adjacent the second p-type region between the central portion and the annular portion and adjacent to the second surface, the third n-type region forming an annular emitter-base junction with the second p-type region that is generally concentric with the annular emitter-base junction formed by the first n-type region and the first p-type region;

first electrode means connected to the face of the first n-type region and the central portion of the first p-type region and shorting the inner edge of the first annular emitter-base junction;

second electrode means connected to the face of the third annular n-type region and the face of the annular portion of the second p-type region and shorting the outer edge of the second annular emitter-base junction;

first gate electrode means connected to the annular portion of the first p-type region for injecting a gate current into the first p-type region adjacent the outer edge of the annular first emitter-base junction such that the gate current will either pass through the junction or pass transversely across the first p-type region to the electrode contacting the center portion of the p-type region whereby the resistance drop will tend to forward bias the emitter-base junction and trigger the device "on" in the direction corresponding to the forward bias direction of the junction; and second gate electrode means connected to the center portion of the second p-type region for injecting a gate current into the second p-type region adjacent the inner edge of the annular second emitter-base junction such that the gate current will either pass through the junction of pass transversely across the second p-type region to the second electrode contacting the annular portion of the p-type region whereby the resistance drop will tend to forward bias the emitter-base juncion and trigger the device "on" in the direction corresponding to the forward bias direction of the junction.

3. A gated switching device as defined in claim 2 wherein:

the effective areas of the first and second annular emitter-base junctions are substantially equal.

4. A gated switching device as defined in claim 3 wherein:

the first and third annular n-type regions have substantially equal thicknesses and surface concentrations; and corresponding portions of the p-type regions have substantially equal thicknesses and surface concentrations.

5. A gated semiconductor switching device comprising:

a semiconductor body having successive n-p-n-p-n type regions forming first and second p-n-p-n switching areas with opposite bias directions having a first n-type semiconductor region, first and second p-type semiconductor regions on each side of said first n-type semiconductor region forming junctions therebetween, second and third n-type semiconductor regions adjacent said first and second said p-type semiconductor regions, respectively, thereby forming first and second emitter-base junctions, said second and third n-type regions do not overshadow and form common surfaces with portions of the respective adjacent p-type regions;

first terminal means connected to the first n-p type regions and shorting out one edge of the junction formed therebetween;

second terminal means connected to the last p-n type regions and shorting out one edge of the junction formed therebetween, said first and second terminal means each comprises a conductive eletrode extending over the respective common surfaces and in ohmic contact with each of the active regions forming the respective common surfaces; and first and second gate terminals connected to the p-type regions at a point opposite said respective shorted edges of the respective junctions, whereby a current injected through the respective gate terminals into the respective p-type regions will either flow through the adjacent emitter-base junction or flow transversely through the respective p-type region before it reaches the shorted junction and thereby tend to forward bias the emitter-base junction causing it to conduct and trigger the device "on" in the direction corresponding to the forward bias direction of the respective emitter-base junction.

References Cited

UNITED STATES PATENTS

| | | | |
|---|---|---|---|
| 2,966,434 | 12/1960 | Hibberd | 148—33 |
| 2,980,810 | 4/1961 | Goldey | 307—88.5 |
| 3,123,750 | 3/1964 | Hutson et al. | 317—235 |
| 3,158,746 | 11/1964 | Lehovec | 250—199 |
| 3,196,330 | 7/1965 | Moyson | 317—235 |
| 3,274,463 | 9/1966 | Hutson | 317—235 |
| 3,275,909 | 9/1966 | Gutzwiller | 317—235 |
| 3,310,687 | 3/1967 | Howell | 307—88.5 |
| 3,317,746 | 5/1967 | Hutson | 307—88.5 |

FOREIGN PATENTS

| | | |
|---|---|---|
| 1,267,417 | 6/1961 | France. |
| 945,249 | 12/1963 | Great Britain. |

JOHN W. HUCKERT, *Primary Examiner.*

RONALD SANDLER, *Assistant Examiner.*